(12) United States Patent
Jiang

(10) Patent No.: US 6,480,392 B1
(45) Date of Patent: Nov. 12, 2002

(54) RETAINING AND FIXING STRUCTURE OF INTERFACE CARD

(75) Inventor: Yue-Wen Jiang, Chia I Hsien (TW)

(73) Assignee: Lite-On Enclosure Inc., Taipei (TW)

( * ) Notice: Subject to any disclaimer, the term of this patent is extended or adjusted under 35 U.S.C. 154(b) by 0 days.

(21) Appl. No.: 09/906,103

(22) Filed: Jul. 17, 2001

(51) Int. Cl.$^7$ ................................................ H05K 5/04
(52) U.S. Cl. ...................... 361/755; 361/796; 361/683; 361/740; 312/223.2
(58) Field of Search ................................. 361/755, 683, 361/725, 796, 759, 801, 802, 740; 312/223.2; 70/208; 403/24, 409.1

(56) References Cited

U.S. PATENT DOCUMENTS

| | | | | |
|---|---|---|---|---|
| 6,138,839 A | * | 10/2000 | Cranston et al. | 211/41.17 |
| 6,215,668 B1 | * | 4/2001 | Hass et al. | 24/553 |
| 6,231,139 B1 | * | 5/2001 | Chen | 312/223.2 |

* cited by examiner

Primary Examiner—David Martin
Assistant Examiner—Hung Bui
(74) Attorney, Agent, or Firm—Rosenberg, Klein & Lee

(57) ABSTRACT

The present invention provides a retaining and fixing structure of interface card comprising an integrally formed retaining structure. The retaining structure is fixedly disposed on a leaf. One side of the leaf forms a pivot, which can be pivotally joined with a pivotal portion inside a computer housing. The retaining structure has a first press device thereon. A connection unit is also provided. The retaining structure can be joined with the connection unit, which has a second press device thereon. The second press device can control a resilient device. The first and second press devices can be used to let the retaining structure and the connection unit be quickly unlocked or joined together, hence facilitating maintenance, replacement, or expansion of interface card inside a mainframe for a user.

8 Claims, 6 Drawing Sheets

RETAINING AND FIXING STRUCTURE OF INTERFACE CARD

FIELD OF THE INVENTION

The present invention relates to a retaining and fixing structure of an interface card and, more particularly, to a retaining and fixing structure used in an interface card of a mainframe to facilitate maintenance, replacement, or expansion of interface card for a user.

BACKGROUND OF THE INVENTION

As shown in FIG. 1, a prior art fixing structure of interface card of a mainframe comprises a computer housing 10, which has a plurality of slots 11 thereon. A plurality of interface cards 14 can be inserted and received in the plurality of slots 11. Screw holes 12 are disposed beside the slots 11. Screws 13 can match the screw holes 12 to penetrate through and fix the interface cards 14 and spacers 15. The spacers 15 can block leakage of electromagnetic waves.

Each of the spacers 15 has a plurality of resilient sheets 16 thereon. When the interface cards 14 are inserted and received in the slots 11, the resilient sheets 16 can tightly contact the interfaces 14 and block leakage of electromagnetic waves.

As shown in FIG. 1, if a user needs not to use the slots 11 or only needs to use part of them for insertion of a few of the interface cards 14, the slots 11 without the interface cards 14 inserted can be covered with cover plates 17. The cover plates 17 can be screwed with a plurality of screws 13 to prevent dust from entering into the slots 11 to affect normal operation of the mainframe, The cover plates 17 can also block leakage of electromagnetic waves.

The above prior art structure needs to use a screwdriver to perform assembly work. However, because the volume of the present screwdriver is small, if the user misses the screwdriver, the assembly work cannot be performed.

Or if the applied force is too large when the screws 13 are screwed, the screws 13 will easily crumble so that the screws 13 will idle and cannot be screwed tightly. It is necessary to replace the screws to perform the action of screwing, hence wasting resources and increasing assembly cost.

Accordingly, the above fixing structure of interface card of a mainframe has inconvenience and drawbacks in practical installation or use. The present invention aims to resolve the problems in the prior art.

SUMMARY OF THE INVENTION

The primary object of the present invention is to provide a retaining and fixing structure of interface card, whereby a screwdriver is not needed when assembling an interface card, and there is no trouble of crumbling of screws, hence avoiding waste of resources and saving assembly cost.

The secondary object of the present invention is to provide a retaining and fixing structure of interface card, whereby professional tools are not needed when assembling or disassembling an interface, hence shortening time of maintenance, replacement, expansion, and assembly of interface card and conforming to time-saving requirement.

To achieve the above objects, the present invention provides a retaining and fixing structure of interface card comprising a leaf, a retaining structure, and a connection unit. One side of the leaf forms a pivot and can be pivotally joined with a pivotal portion inside a computer housing to facilitate rotation of the leaf in the pivotal portion. The retaining structure can be integrally formed with the leaf, or can be joined with the leaf by means of tin soldering, hard soldering, supersonic soldering, or resistance soldering. The retaining structure can be joined with the connection unit. A first and a second press devices can be used to let the retaining structure and the connection unit be quickly unlocked or joined together, hence facilitating maintenance, replacement, or expansion of interface card in a mainframe for a user, and shortening time of maintenance, replacement, expansion, and assembly of interface card.

The various objects and advantages of the present invention will be more readily understood from the following detailed description when read in conjunction with the appended drawing, in which:

DETAILED DESCRIPTION OF THE PREFERRED EMBODIMENTS

As shown in FIGS. 2 to 4A, the present invention related to a retaining and fixing structure of interface card and, more particularly, to a retaining and fixing structure used in an interface card of a mainframe to facilitate maintenance, replacement, and expansion of interface card for a user. The retaining and fixing structure of the present invention comprises a leaf 20, a retaining structure 30, and a connection unit 40.

Figure 1:
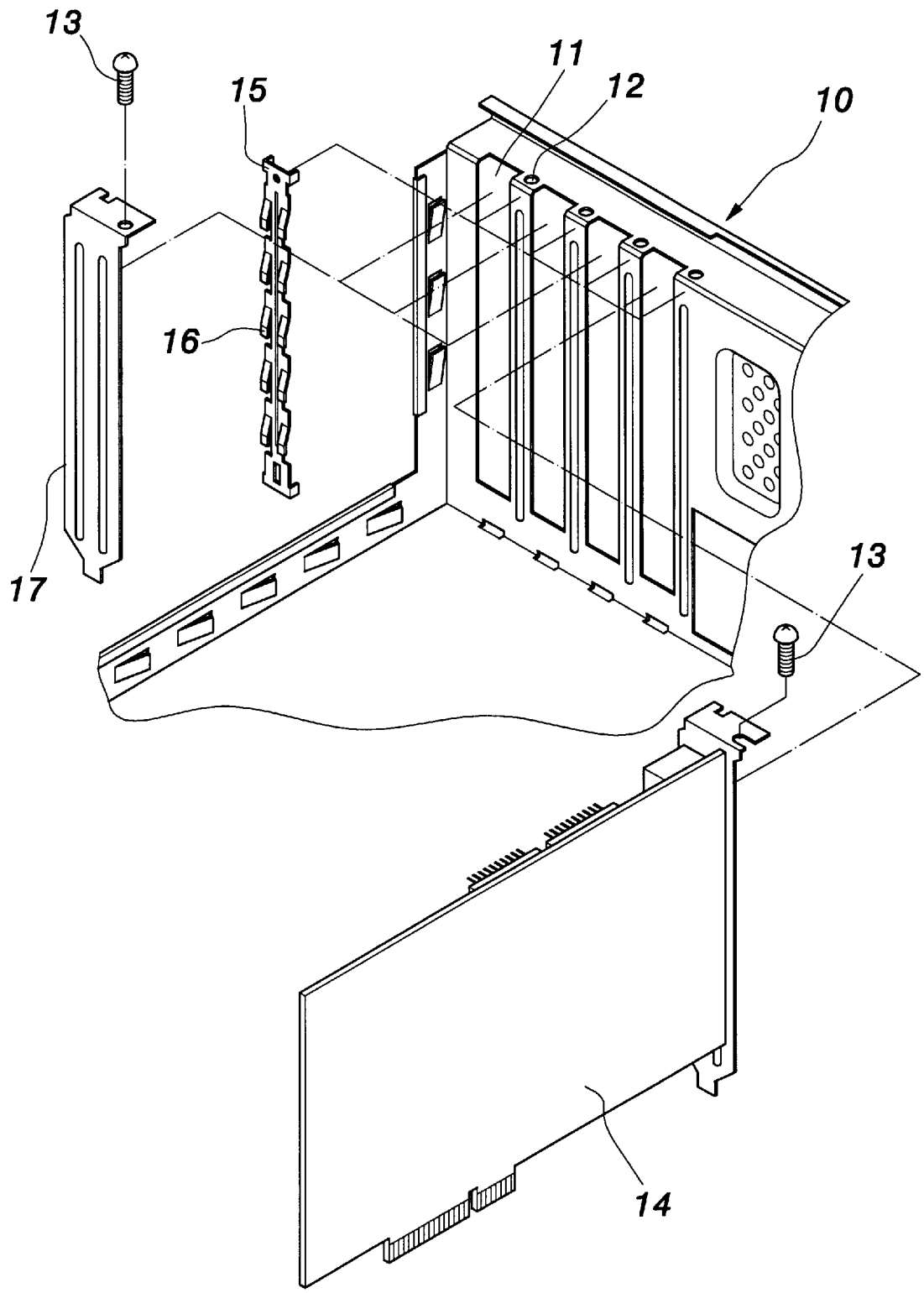
FIG. 1 is an exploded perspective view of a prior art fixing structure of interface card.
Figure 2:
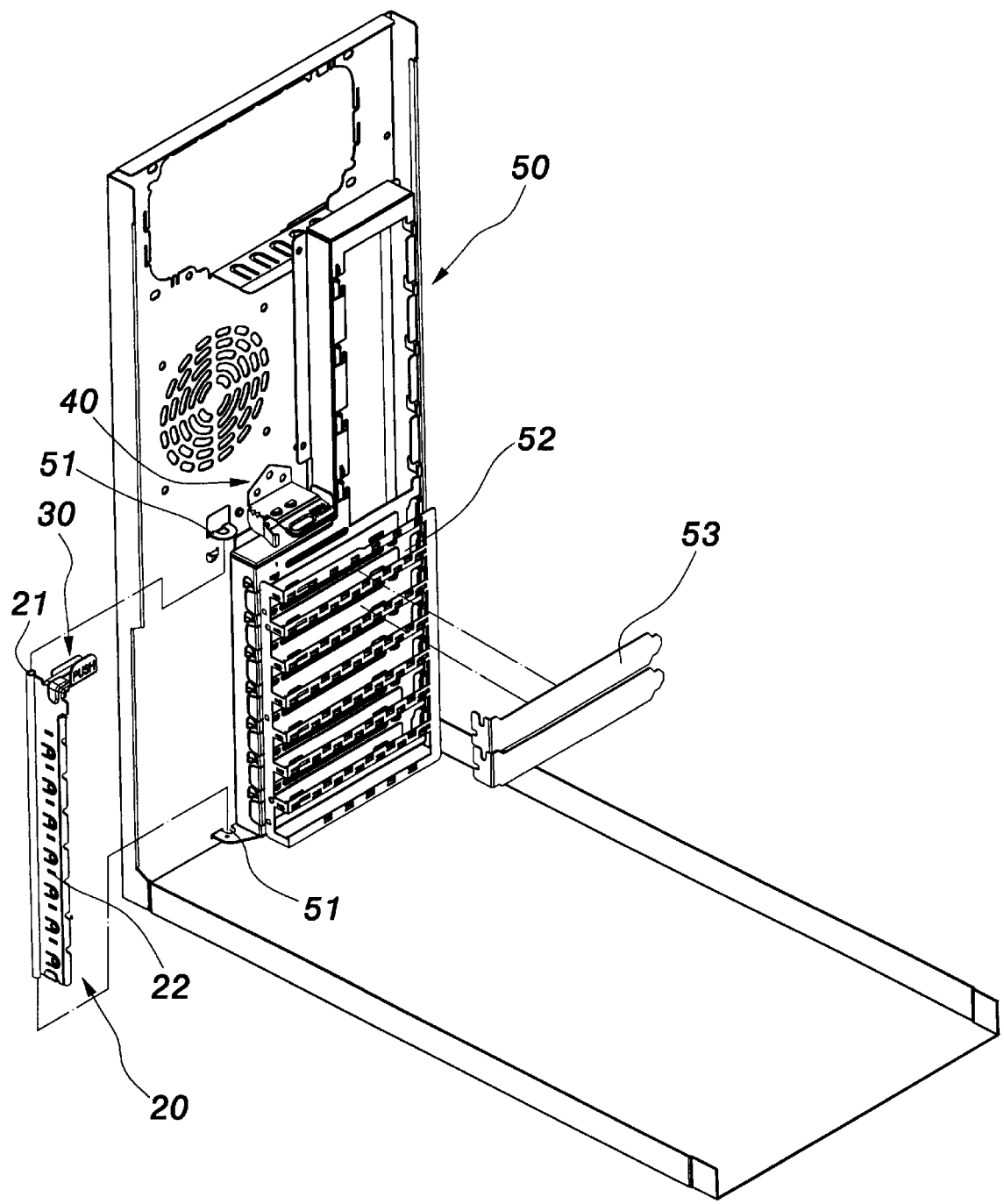
FIG. 2 is an exploded perspective view of the present invention.

The leaf 20 has a plurality of joining grooves 22 thereon, which can be joined with interface cards (not shown). One side of the leaf 20 forms a pivotal portion or a pivot 21, as shown in FIG. 2. The pivot 21 can be pivotally joined with a pivotal portion 51 inside a computer housing 50. After the pivot 21 is pivotally joined with the pivotal portion 51 of the computer housing 50, the leaf 20 can rotate in the pivotal portion 51.

Figure 3:
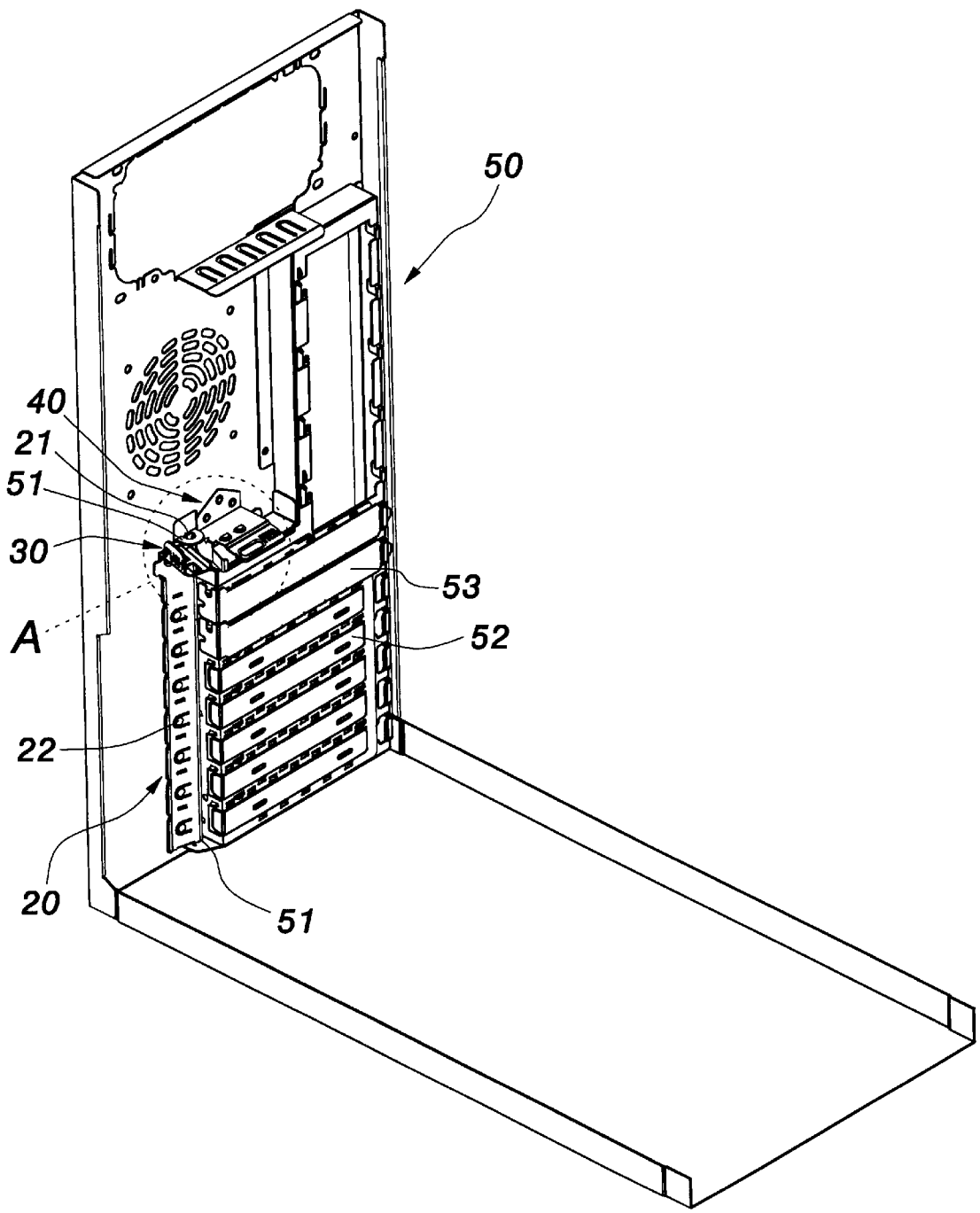
FIG. 3 is a perspective view of the present invention.
Figure 3A:
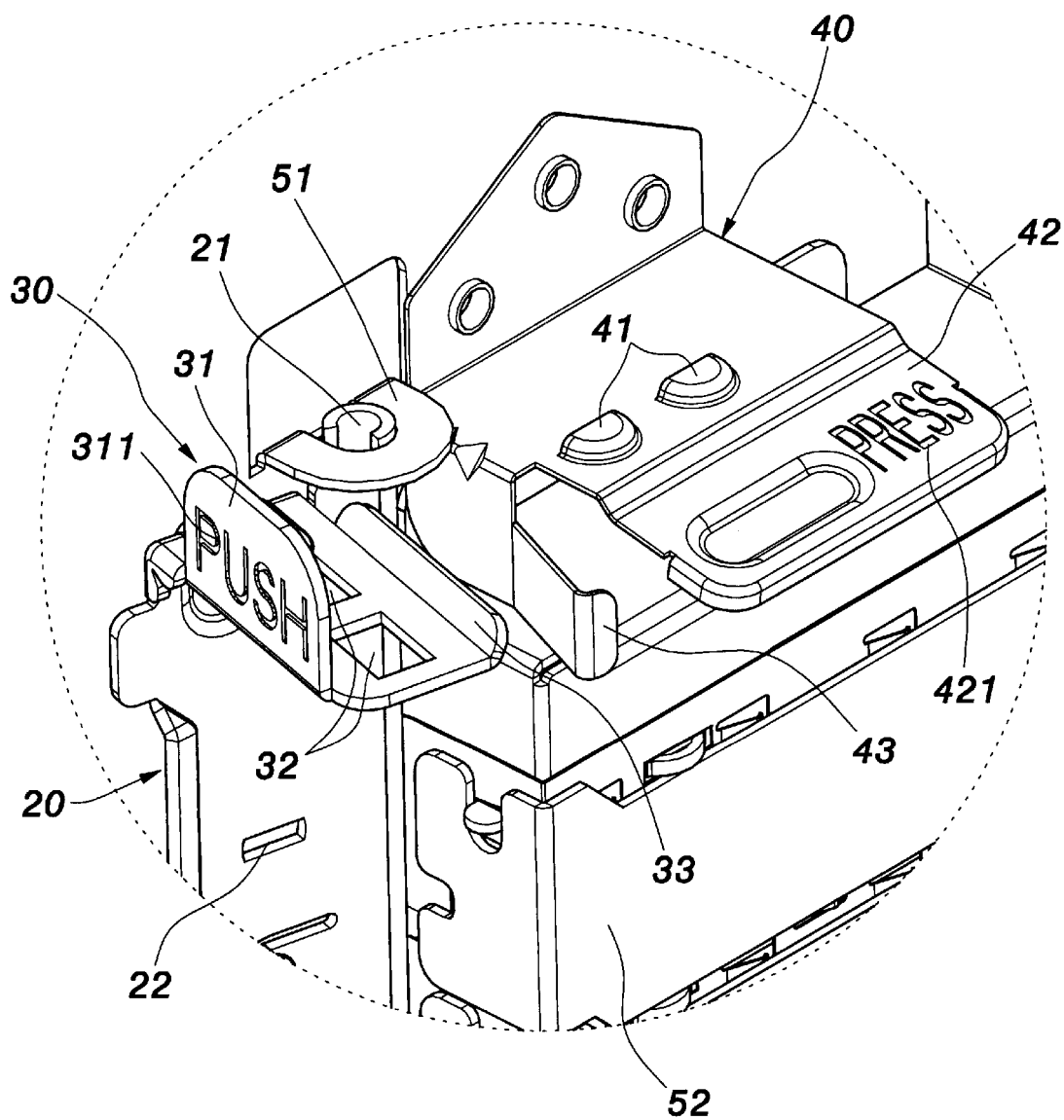
FIG. 3A is an enlarged view of part A shown in FIG. 3.

The retaining structure 30 is roughly L-shaped, as shown in FIG. 3A. The retaining structure 30 can be integrally formed with the leaf 20, or can be joined with the leaf 20 by means of tin soldering, hard soldering, supersonic soldering, or resistance soldering. The retaining structure 30 has a first press device 31 thereon, as shown in FIG. 3A. The first press device 30 has indication words 311 thereon. The indication words 311 are used to let a user understand the action of the first press device.

Figure 4:
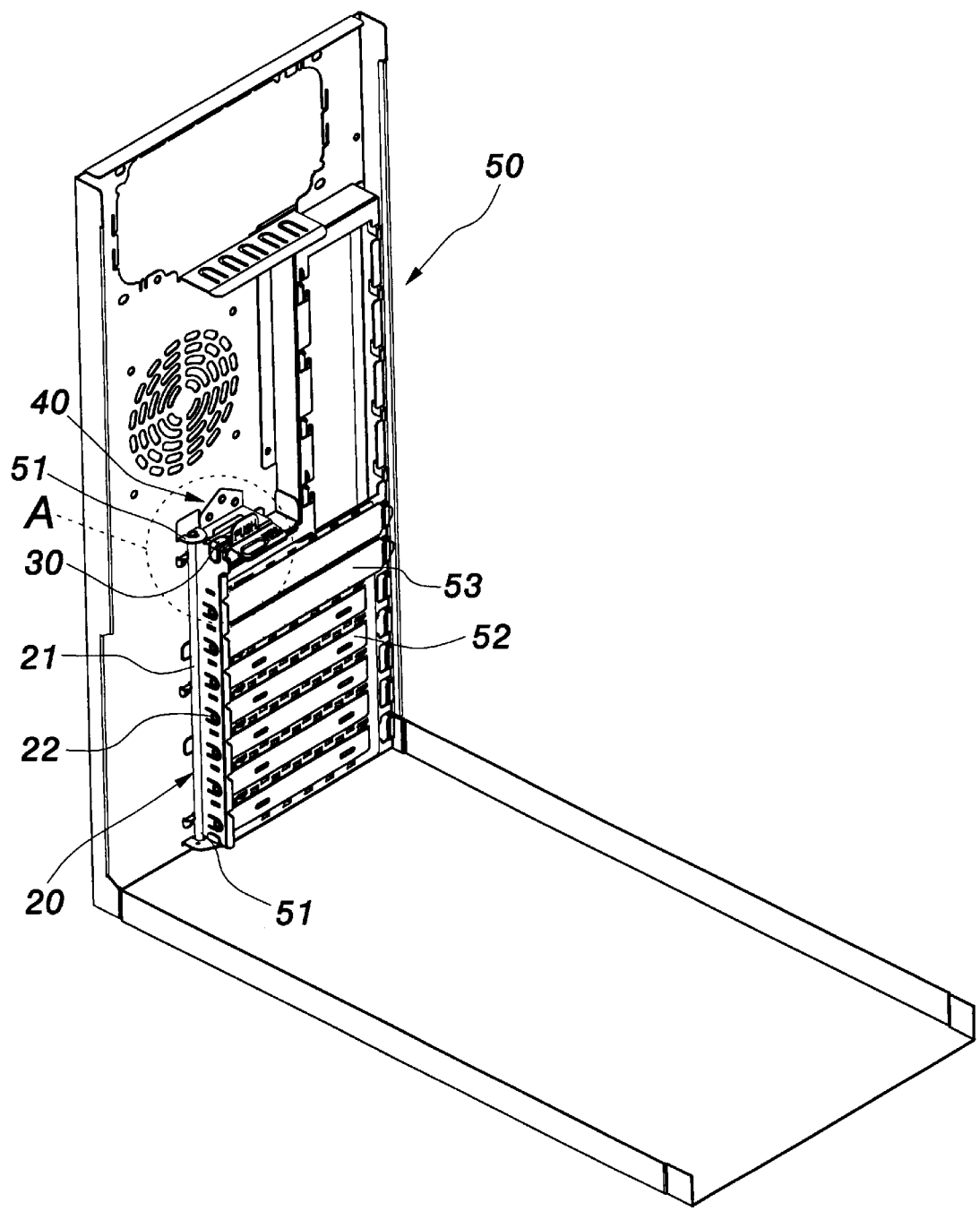
FIG. 4 is another perspective view of the present invention.
Figure 4A:
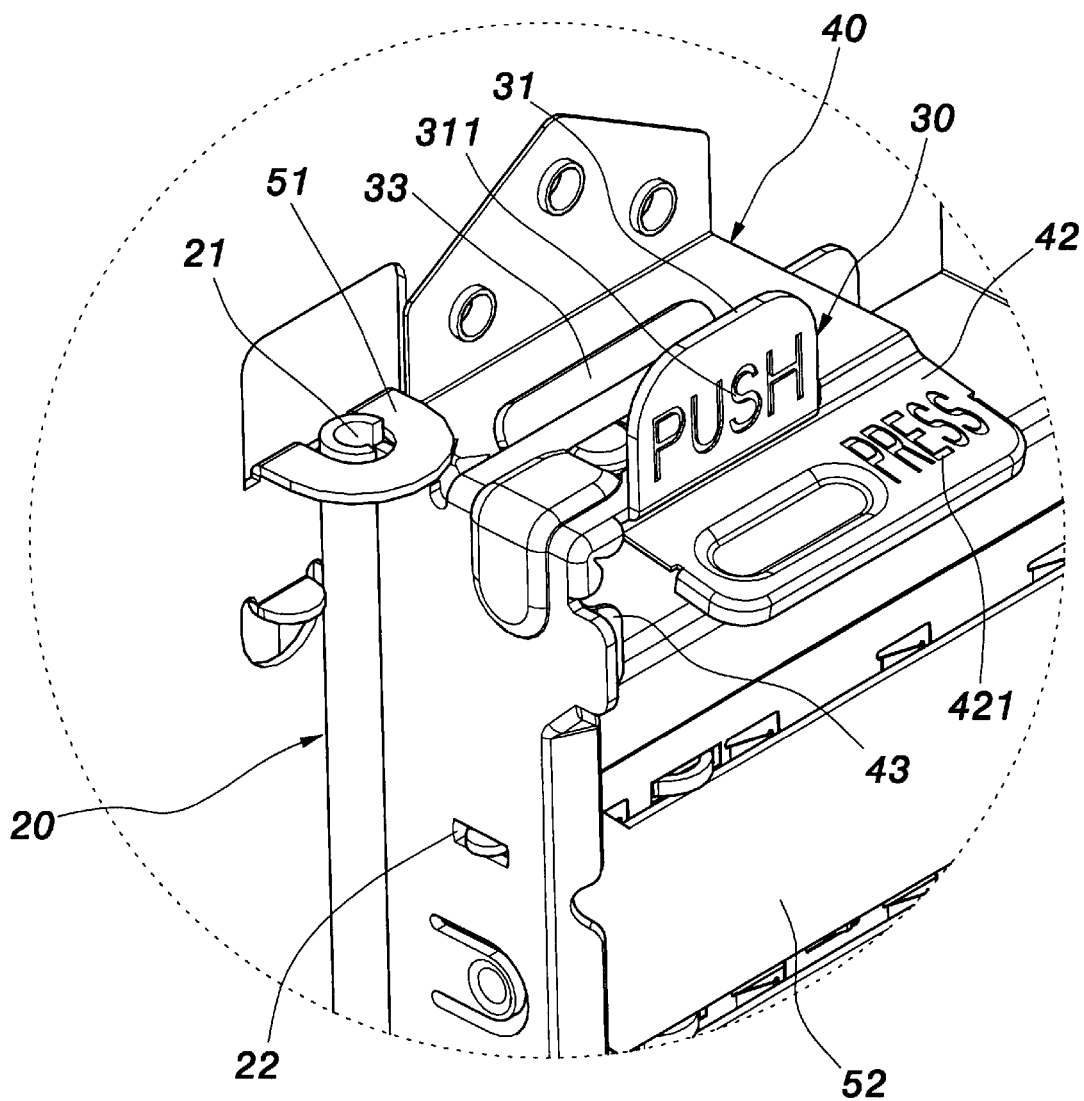
FIG. 4A is an enlarged view of part A shown in FIG. 4.

The retaining structure 30 has two grooves 32 and a guide sheet 33 thereon. The grooves 32 of the retaining structure 30 can be joined with the connection unit 40. The connection unit 40 has two flanges 41 matched with the two grooves 32. The two flanges 41 can be retained with the grooves 32, as shown in FIG. 4A. The guide sheet 33 can let the two flanges 41 of the connection unit 40 be retained in the grooves 32 of the retaining structure 30. The connection unit 40 has a second press device 42 thereon, as shown in FIG. 3A. The second press device 42 has indication words 421 thereon.

The indication words are used to let a user understand the action of the second press device 42.

One side of the connection unit 40 has a resilient device 43, which abuts against the leaf 20, as shown in FIG. 4A. The resilient device 43 can let the retaining structure 30 spring off sideward.

The inside of the computer housing 50 has a plurality of insertion slots 52, as shown in FIG. 2. A plurality of interface cards can be inserted into the insertion slots 52. If a user needs not to use the interface cards 14 or only needs to use only a few of them, the insertion slots 52 without the interface cards inserted can be covered with cover plates 53 matched with the insertion slots 52, as shown in FIG. 3. The cover plates 53 can prevent dust from entering into the insertion slots 52 to affect normal operation of software and hardware inside the computer housing 50. The cover plates 53 can also block leakage of electromagnetic waves inside the computer housing 50.

When a user is to insert an interface card into one of the insertion slots 52 inside the computer housing 50, the first press device 31 on the retaining structure 30 can be pressed toward one side of the connection unit 40. Because the indication words 311 are disposed on the first press device 31, the user can clearly understand the action of the first press device 31.

Moreover, because the retaining structure 30 is joined on the leaf 20, after the retaining structure 30 is pressed by the user, the leaf 20 and the retaining structure 30 will be joined toward one side of the connection unit 40. Therefore, the two flanges 41 on the connection unit 40 will be retained into the two grooves 32 on the retaining structure, and the joining grooves 22 on the leaf 20 will be joined and retained on the interface card.

When the user is to maintain, replace, or expand interface cards inside the computer housing 50, the retaining structure 30 is separated from the connection unit 40. The indication words 421 are disposed on the second press device 42 to let the user understand the action of the second press device 42.

Furthermore, after the second press device 42 of the connection unit 40 is pressed downwards, the connection unit 40 can let the two flanges 41 and the two grooves 32 be separated. Because the resilient device 43 of the connection unit 40 abuts against the leaf 20, after the two flanges 41 and the two grooves 32 are separated, the resilient device 43 will let the leaf 20 and the retaining structure 30 spring off sideward, and let the joining grooves 22 on the leaf 20 be separated from the interface cards.

To sum up, the present invention utilizes an integrally formed retaining structure to join a connection unit, and makes use of a first and a second press devices to let the retaining structure and the connection unit be quickly unlocked or joined together, thereby facilitating maintenance, replacement, or expansion of interface card inside a computer mainframe, shortening time of maintenance, replacement, expansion, and assembly of interface card, and conforming to time-saving requirement.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. A retaining and fixing structure for fixing a plurality of interface cards in a computer housing comprising:

(a) a leaf member extending in a vertical direction having a pivot member pivotally coupled to said computer housing for pivoting said leaf member about a vertical axis;

(b) a retaining structure fixedly coupled to an upper surface of said leaf member, said retaining structure being substantially L-shaped in contour defining a base member and a first press member and having at least one retention opening formed through said base member, said retaining structure and said leaf member combination being pivotal about said vertical axis in unison; and (c) a connection unit coupled to said computer housing forming a first portion having at least one flange member extending from an upper surface thereof, and a second portion defining a second press member whereby said retaining structure is rotatable over said flange member and said flange member extends through said retaining opening for capture of said retaining structure by said connection unit.

2. The retaining and fixing structure as recited in claim 1 wherein said leaf member includes a plurality of grooves formed therein for alignment with said interface cards.

3. The retaining and fixing structure as recited in claim 1 wherein said second press member is displaceable to reversibly remove and insert said flange from and into said retaining opening.

4. The retaining and fixing structure as recited in claim 3 wherein said second press member includes operational indicia formed thereon on an upper surface thereof.

5. The retaining and fixing structure as recited in claim 1 wherein said retaining structure is formed integral with said leaf member.

6. The retaining and fixing structure as recited in claim 1 wherein said retaining structure is soldered to said leaf member.

7. The retaining and fixing structure as recited in claim 1 wherein said first press member includes operational indicia formed on an outer surface thereof.

8. The retaining and fixing structure as recited in claim 1 wherein said connection unit includes a resilient extension member for interface with said leaf member when said retaining structure is captured by said connection unit whereby said retaining structure is displaceably rotated responsive to removal of said flange from said retention opening.

* * * * *